United States Patent
Yokoi et al.

(10) Patent No.: US 9,159,820 B2
(45) Date of Patent: Oct. 13, 2015

(54) BURIED GATE STATIC INDUCTION THYRISTOR

(71) Applicant: NGK Insulators, Ltd., Nagoya (JP)

(72) Inventors: Shoji Yokoi, Nagoya (JP); Naohiro Shimizu, Miura (JP); Masakazu Kimura, Hamamatsu (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 13/721,409

(22) Filed: Dec. 20, 2012

(65) Prior Publication Data

US 2013/0161691 A1 Jun. 27, 2013

(30) Foreign Application Priority Data

Dec. 22, 2011 (JP) ................. 2011-282028
Dec. 13, 2012 (JP) ................. 2012-272125

(51) Int. Cl.
*H01L 29/74* (2006.01)
*H01L 29/10* (2006.01)

(52) U.S. Cl.
CPC ............ *H01L 29/74* (2013.01); *H01L 29/1066* (2013.01)

(58) Field of Classification Search
USPC ........................... 257/136, E29.196, E29.211
IPC ........... H01L 29/74,29/102, 29/0839, 29/42308
See application file for complete search history.

(56) References Cited

U.S. PATENT DOCUMENTS

| | | | |
|---|---|---|---|
| 4,209,795 A | 6/1980 | Nonaka | |
| 4,772,926 A * | 9/1988 | Nishizawa et al. | 257/136 |
| 4,872,044 A | 10/1989 | Nishizawa et al. | |
| 4,984,049 A * | 1/1991 | Nishizawa et al. | 257/136 |
| 5,591,991 A * | 1/1997 | Terasawa | 257/137 |
| 6,558,996 B1 | 5/2003 | Shimizu | |
| 6,600,192 B1 * | 7/2003 | Sugawara et al. | 257/329 |
| 7,414,333 B2 | 8/2008 | Hatano | |

FOREIGN PATENT DOCUMENTS

| | | |
|---|---|---|
| JP | 09-008280 A1 | 1/1997 |
| JP | 2000-058814 A1 | 2/2000 |
| JP | 2001-119014 A1 | 4/2001 |
| JP | 2004-072994 A1 | 3/2004 |

OTHER PUBLICATIONS

Semiconductor Manufacturing Technology. Michael Quirk, Julian Serda. 2001. Prentice Hall Inc. p. 289.*
U.S. Appl. No. 13/721,379, filed Dec. 20, 2012, Yokoi et al.
U.S. Non-Final Office Action, U.S. Appl. No. 13/721,379, dated Apr. 18, 2013 (8 pages).

(Continued)

*Primary Examiner* — Marcos D Pizarro
(74) *Attorney, Agent, or Firm* — Burr & Brown, PLLC

(57) ABSTRACT

A semiconductor device contains a semiconductor substrate, a cathode, an anode, and a gate electrode. The semiconductor device has a cathode segment disposed in a portion corresponding to at least the cathode, an anode segment disposed in a portion corresponding to the anode, a plurality of embedded segments disposed in a portion closer to the cathode segment than to the anode segment, a takeoff segment disposed between the gate electrode and the embedded segments to electrically connect the gate electrode to the embedded segments, and a channel segment disposed between the adjacent embedded segments.

11 Claims, 5 Drawing Sheets

(56) References Cited

OTHER PUBLICATIONS

Final Office Action, U.S. Appl. No. 13/721,379, dated Nov. 20, 2013 (11 pages).

Quirk, M., et al. "Semiconductor Manufacturing Technology," *Prentice Hall Inc.,* 2001, pp. 220-221.

\* cited by examiner

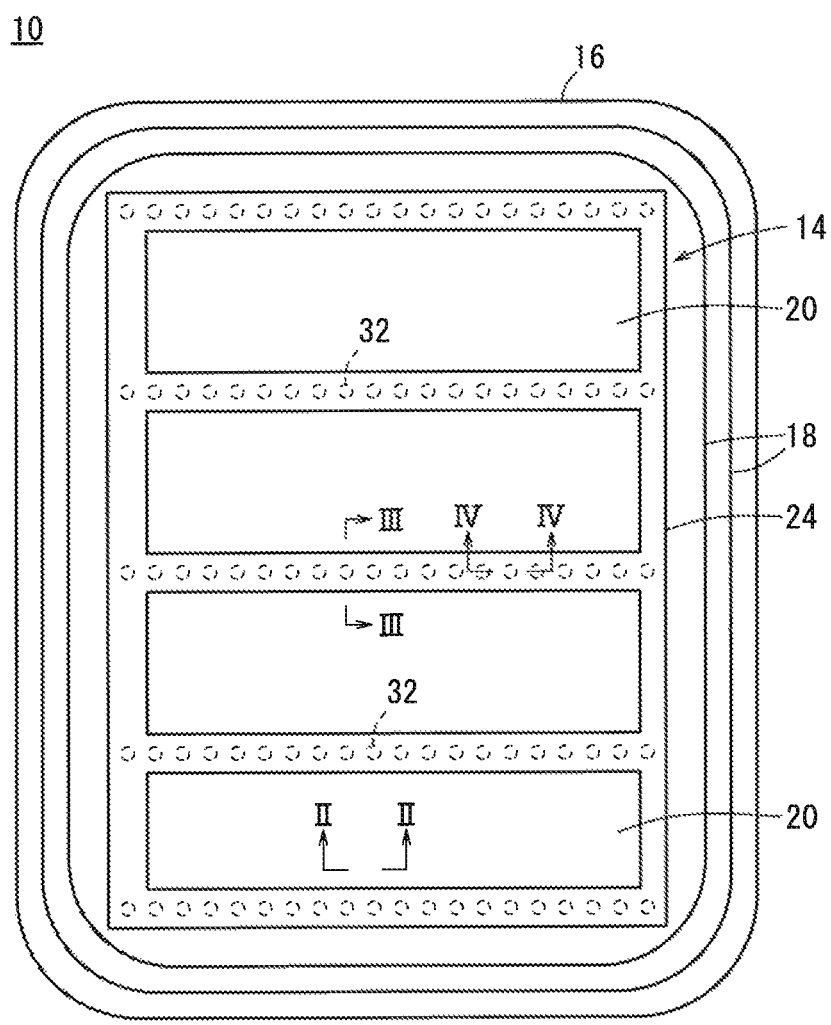

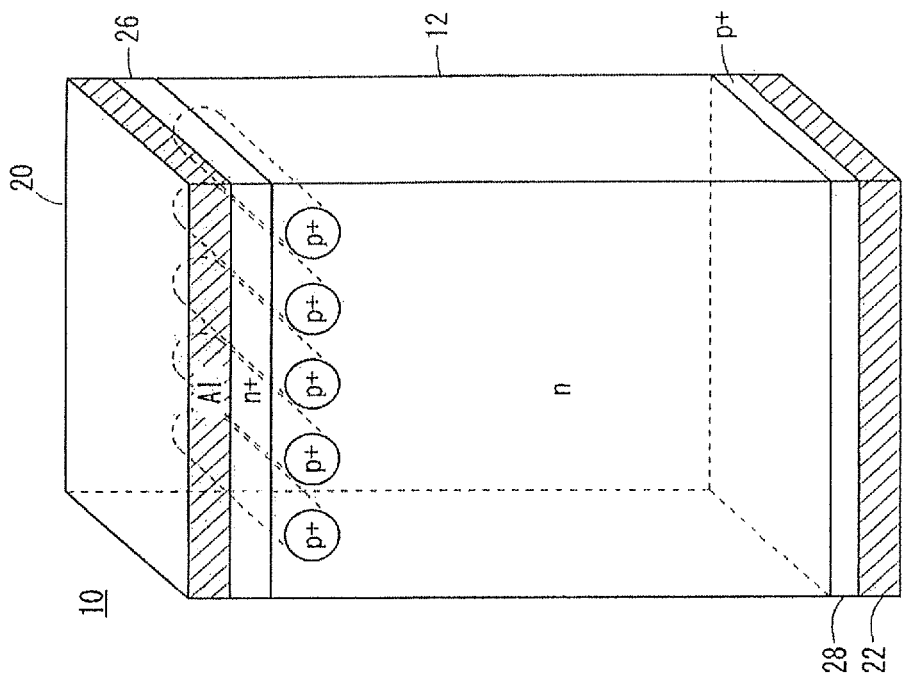
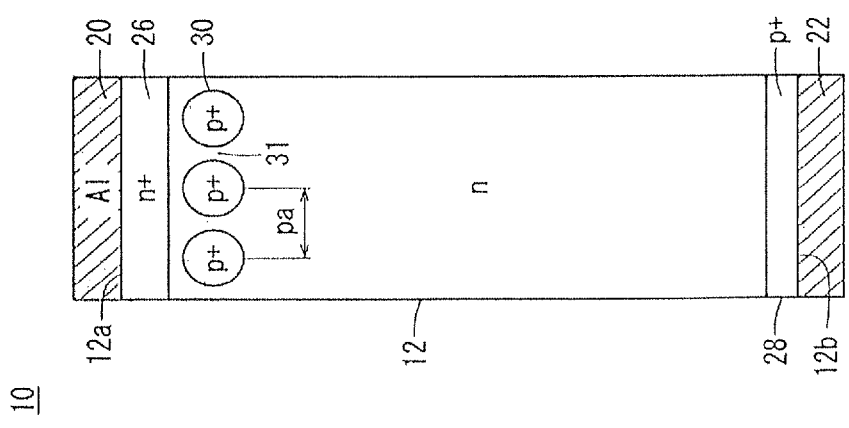

BURIED GATE STATIC INDUCTION THYRISTOR

CROSS-REFERENCE TO RELATED APPLICATION

This application is based upon and claims the benefit of priority from Japanese Patent Applications No. 2011-282028 filed on Dec. 22, 2011 and No. 2012-272125 filed on Dec. 13, 2012, the contents all of which are incorporated herein by reference.

BACKGROUND OF THE INVENTION

1. Field of the Invention

The present invention relates to a semiconductor device containing an anode formed on one surface of a semiconductor part and a plurality of cathode segments formed on the other surface of the semiconductor part, suitable for use in a static induction thyristor, a GTO thyristor, etc.

2. Description of the Related Art

In static induction thyristors, GTO thyristors, and the like, in general, an anode is formed on a back surface of a silicon substrate, and a large number of cathode segments are disposed on a front surface of the silicon substrate. A gate region is disposed around the cathode segments, and a gate electrode wiring is formed on the gate region (see Japanese Laid-Open Patent Publication Nos. 2001-119014, H09-008280, and 2000-058814).

SUMMARY OF THE INVENTION

An object of the present invention is to provide a semiconductor device capable of exhibiting a reduced effective chip area and improved turn-on and turn-off switching speeds in the above static induction thyristors, GTO thyristors, and the like.

[1] According to a first aspect of the present invention, there is provided a semiconductor device containing a first conductive type semiconductor substrate, at least one cathode formed on one surface of the semiconductor substrate, an anode formed on the other surface of the semiconductor substrate, and a gate electrode electrically insulated from the cathode, formed on the one surface of the semiconductor substrate to control current conduction between the cathode and the anode, wherein the semiconductor device has a first conductive type cathode segment disposed in a portion corresponding to at least the cathode in the one surface of the semiconductor substrate, a second conductive type anode segment disposed in a portion corresponding to the anode in the other surface of the semiconductor substrate, a plurality of second conductive type embedded segments sandwiched between the cathode segment and the anode segment in the semiconductor substrate, disposed in a portion closer to the cathode segment than to the anode segment, a second conductive type takeoff segment disposed between the gate electrode and the embedded segments to electrically connect the gate electrode to the embedded segments, and a first conductive type channel segment disposed between the embedded segments adjacent to each other.

[2] In the invention, the semiconductor device may contain a plurality of the cathodes, the gate electrode may have a frame shape surrounding the cathodes, and the takeoff segment may be disposed immediately below the gate electrode to electrically connect the gate electrode to the embedded segments.

[3] In the invention, the semiconductor device may have an epitaxial layer containing the cathode segment, the embedded segments, and the takeoff segment at the side of the one surface of the semiconductor substrate, and the epitaxial layer preferably has a thickness of at least 0.5 μm and less than 13 μm.

[4] In the invention, the epitaxial layer preferably has a thickness of 0.5 to 10 μm.

[5] In the invention, the epitaxial layer preferably has a thickness of 1 to 10 μm.

[6] In the invention, the epitaxial layer preferably has a thickness of 1 to 5 μm.

[7] In the invention, the epitaxial layer particularly preferably has a thickness of 1 to 2 μm.

[8] In the invention, the semiconductor substrate preferably has a thickness of 440 μm or less.

[9] In the invention, the anode segment preferably has a thickness of 0.02 to 1.0 μm.

By using the semiconductor device of the present invention in the static induction thyristors, GTO thyristors, and the like, the effective chip area can be reduced, and the turn-on and turn-off switching speeds can be improved.

The above and other objects, features, and advantages of the present invention will become more apparent from the following description when taken in conjunction with the accompanying drawings in which a preferred embodiment of the present invention is shown by way of illustrative example.

BRIEF DESCRIPTION OF THE DRAWINGS

FIG. 1 is a top view of a semiconductor device according to an embodiment of the present invention;

FIG. 2A is a cross-sectional view taken along the line II-II in FIG. 1;

FIG. 2B is a transparent perspective view of the section;

DETAILED DESCRIPTION OF THE INVENTION

Figure 3A:
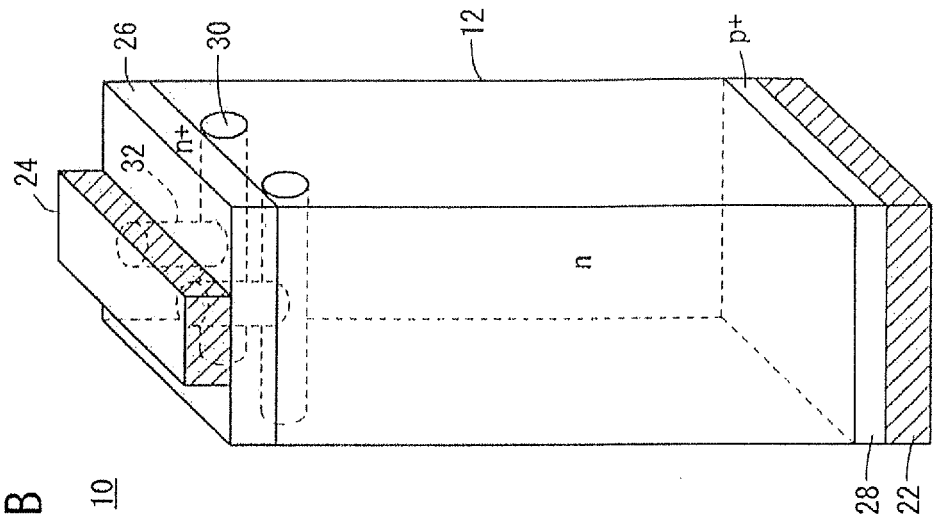
FIG. 3A is a cross-sectional view taken along the line in FIG. 1.
Figure 3B:
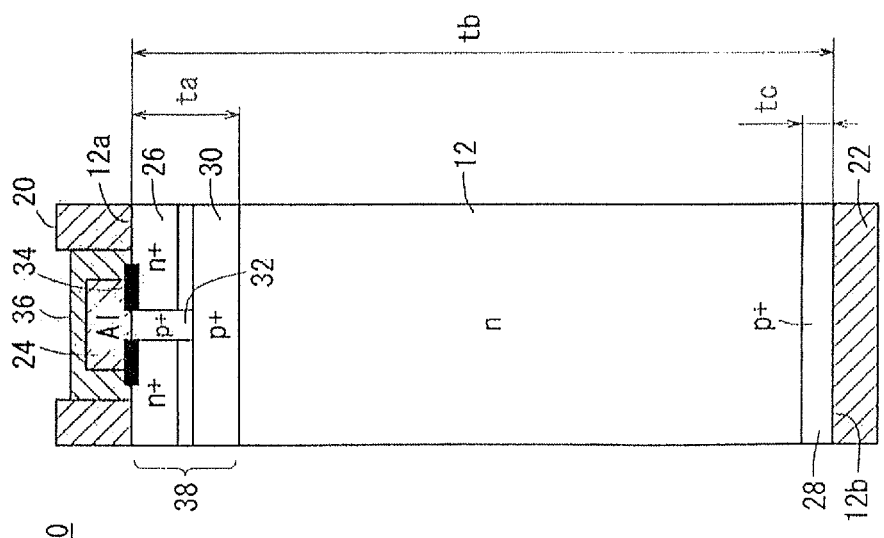
FIG. 3B is a transparent perspective view of the section (an insulating layer is not shown)
Figure 4A:
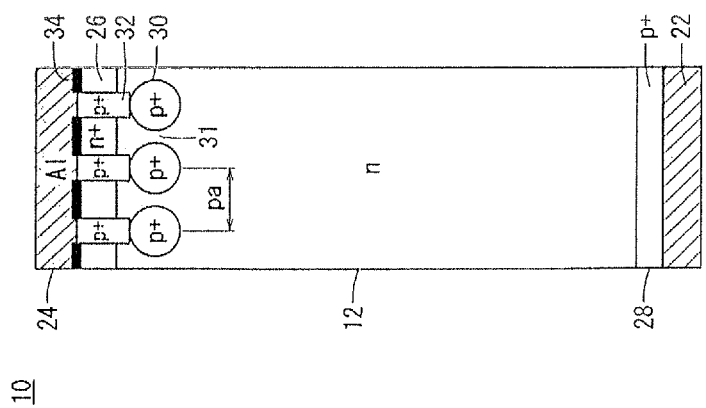
FIG. 4A is a cross-sectional view taken along the line IV-IV in FIG. 1.
Figure 4B:
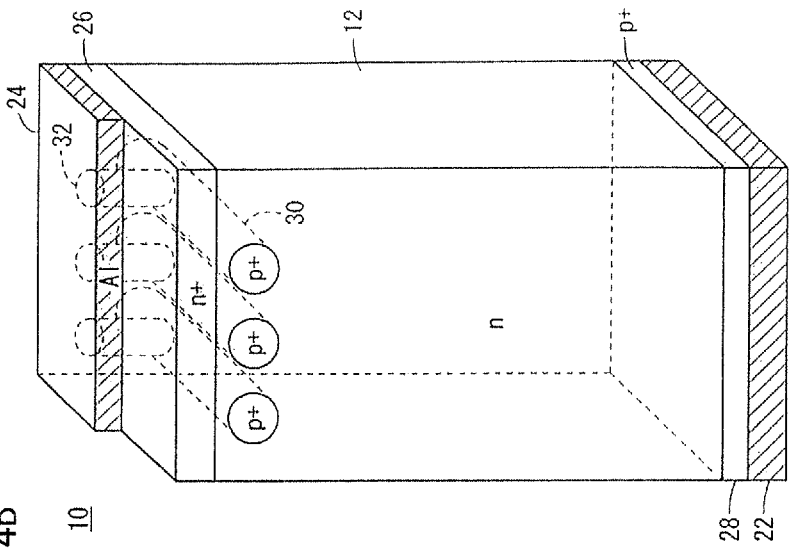
FIG. 4B is a transparent perspective view of the section (an insulating layer is not shown)

An embodiment of the semiconductor device of the present invention, usable in a normally-off embedded gate-type static induction thyristor or the like, will be described below with reference to FIGS. 1 to 5. It should be noted that, in this description, a numeric range of "A to B" includes both the numeric values A and B as the lower limit and upper limit values.

As shown in FIG. 1, a semiconductor device 10 according to this embodiment contains a first conductive type semiconductor substrate 12 (see, e.g., FIGS. 2A and 2B), has an approximately track-like top surface appearance, has an approximately rectangular element region 14 at the center, and has a channel stop region 16 located on the outermost periphery. Further, the semiconductor device 10 has a field limiting region 18 located around the element region 14, i.e. between the element region 14 and the channel stop region 16.

The element region 14 will be mainly described below. As shown in FIGS. 2A and 2B, the semiconductor device 10 contains the first conductive type semiconductor substrate 12, one or more cathodes 20 (e.g. containing a metal) formed on one surface 12a of the semiconductor substrate 12, at least one anode 22 (e.g. containing a metal) formed on the other surface 12b of the semiconductor substrate 12, and a gate electrode 24 (e.g. containing a metal) formed on the one surface 12a of the semiconductor substrate 12, as shown in FIG. 3A, to control current conduction between the cathodes 20 and the anode 22, the gate electrode 24 being electrically insulated from the cathodes 20. In the example of FIG. 1, the semiconductor device 10 contains four cathodes 20, and the gate electrode 24 has a frame shape surrounding the four cathodes 20. Thus, the gate electrode 24 extends between the adjacent cathodes 20 and between each cathode 20 and the field limiting region 18. Though only two lines are shown in the field limiting region 18 in FIG. 1, five to twenty lines are practically formed in the field limiting region 18.

Furthermore, as shown in FIGS. 2A and 2B, in the semiconductor device 10, first conductive type cathode segments 26 are disposed in portions corresponding to at least the cathodes 20 in the one surface 12a of the semiconductor substrate 12, and a second conductive type anode segment 28 is disposed in a portion corresponding to the anode 22 in the other surface 12b of the semiconductor substrate 12.

In addition, as shown in FIGS. 3A, 3B, 4A, and 4B, a plurality of second conductive type embedded segments 30 are sandwiched between the cathode segments 26 and the anode segment 28 in the semiconductor substrate 12. The embedded segments 30 are disposed in portions closer to the cathode segment 26 than to the anode segment 28, and are electrically connected to the gate electrode 24. The embedded segments 30 are at an approximately constant arrangement pitch Pa (see FIG. 4A). First conductive type channel segments 31 are disposed between the adjacent embedded segments 30. The embedded segments 30 and the gate electrode 24 are electrically connected by second conductive type takeoff segments 32 disposed between the embedded segments 30 and the gate electrode 24. First insulating layers 34 are interposed between the gate electrode 24 and the cathode segments 26, and second insulating layers 36 are interposed between the gate electrode 24 and the cathodes 20 (see FIG. 3A).

In this embodiment, the semiconductor device 10 has an epitaxial layer 38 formed by an epitaxial growth process. The epitaxial layer 38 includes the embedded segments 30, the cathode segments 26, and the takeoff segments 32, and further includes first conductive type segments between the embedded segments 30 and the cathode segments 26. In this case, the thickness ta of the epitaxial layer 38 is 0.5 μm or more but less than 13 μm. In this embodiment, the thickness ta is preferably 0.5 to 10 μm, more preferably 1 to 10 μm, further preferably 1 to 5 μm, particularly preferably 1 to 2 μm. For example, when the thickness ta of the epitaxial layer 38 is 13 μm, the arrangement pitch Pa of the embedded segments 30 is 23 μm. In contrast, when the thickness ta of the epitaxial layer 38 is 2 μm, the arrangement pitch Pa of the embedded segments 30 is 12 μm, which is advantageous for reducing the chip area of the semiconductor device 10. When the epitaxial layer 38 has a smaller thickness ta, the one surface 12a of the semiconductor substrate 12 (the upper surface of the epitaxial layer 38) can be a substantially flat surface free from mesa portions, and the cathode 20 can be formed closer to the gate electrode 24. Therefore, such a smaller thickness ta is advantageous for reducing the chip area of the semiconductor device 10. Furthermore, in this embodiment, since the metal gate electrode 24 extends on a large number of the takeoff segments 32 and is electrically connected to a plurality of the embedded segments 30 by the takeoff segments 32, the gate electrode 24 per se can be utilized for forming a shunt structure of the embedded segments 30, and a control signal can be rapidly sent to the embedded segments 30. This leads to improvement in the switching speed of the semiconductor device 10.

Materials of the components may be as follows. For example, the semiconductor substrate 12 is an n-type silicon substrate having an impurity concentration of $10^{13}$ ($cm^{-3}$) order, the cathode segment 26 is an $n^+$ impurity region having an impurity concentration of $10^{19}$ ($cm^{-3}$) order, the anode segment 28, each embedded segment 30, and each takeoff segment 32 are a $p^+$ region having an impurity concentration of $10^{19}$ ($cm^{-3}$) order, the first insulating layer 34 is an $SiO_2$ film, the second insulating layer 36 is an $SiN_x$ film, a polyimide film, or a silicone film, and the cathode 20, the anode 22, and each gate electrode 24 contain aluminum (Al).

The thickness tb of the semiconductor substrate 12 (see FIG. 3A) is less than 460 μm. In this embodiment, the thickness tb is preferably 440 μm or less, more preferably 260 to 440 μm, further preferably 300 to 430 μm, particularly preferably 360 to 410 μm. As long as the thickness tb of the semiconductor substrate 12 is controlled within the above-mentioned range, the on voltage can be lowered to reduce the turn-on loss, though the turn-off leakage current is not reduced. Therefore, the semiconductor device 10 can act to improve the turn-on efficiency in a practical circuit. In view of improving the device efficiency, the turn-on loss reduction has priority over the turn-off loss reduction. Thus, the device efficiency can be improved by controlling the thickness tb of the semiconductor substrate 12 within the above range.

The thickness tc of the anode segment 28 is less than 1.5 μm. In this embodiment, the thickness tc is preferably 0.02 to 1.0 μm, further preferably 0.05 to 0.5 μm, particularly preferably 0.1 to 0.2 μm. When the thickness tc of the anode segment 28 is controlled within the above-mentioned range, the turn-off leakage current can be reduced to reduce the turn-off loss, though the on voltage is not lowered. Therefore, the semiconductor device 10 can act to improve the turn-off efficiency in a practical circuit.

Particularly in this embodiment, since the thickness tb of the semiconductor substrate 12 is less than 460 μm and the thickness tc of the anode segment 28 is less than 1.5 μm, both the turn-on and turn-off losses can be reduced. Consequently, the semiconductor device 10 can act to improve both the turn-on and turn-off efficiencies in a practical circuit.

Evaluation of the turn-on switching speed, turn-off switching speed, turn-on efficiency, and turn-off efficiency of a practical circuit using the semiconductor device 10 of this embodiment will be described below.

Figure 5:
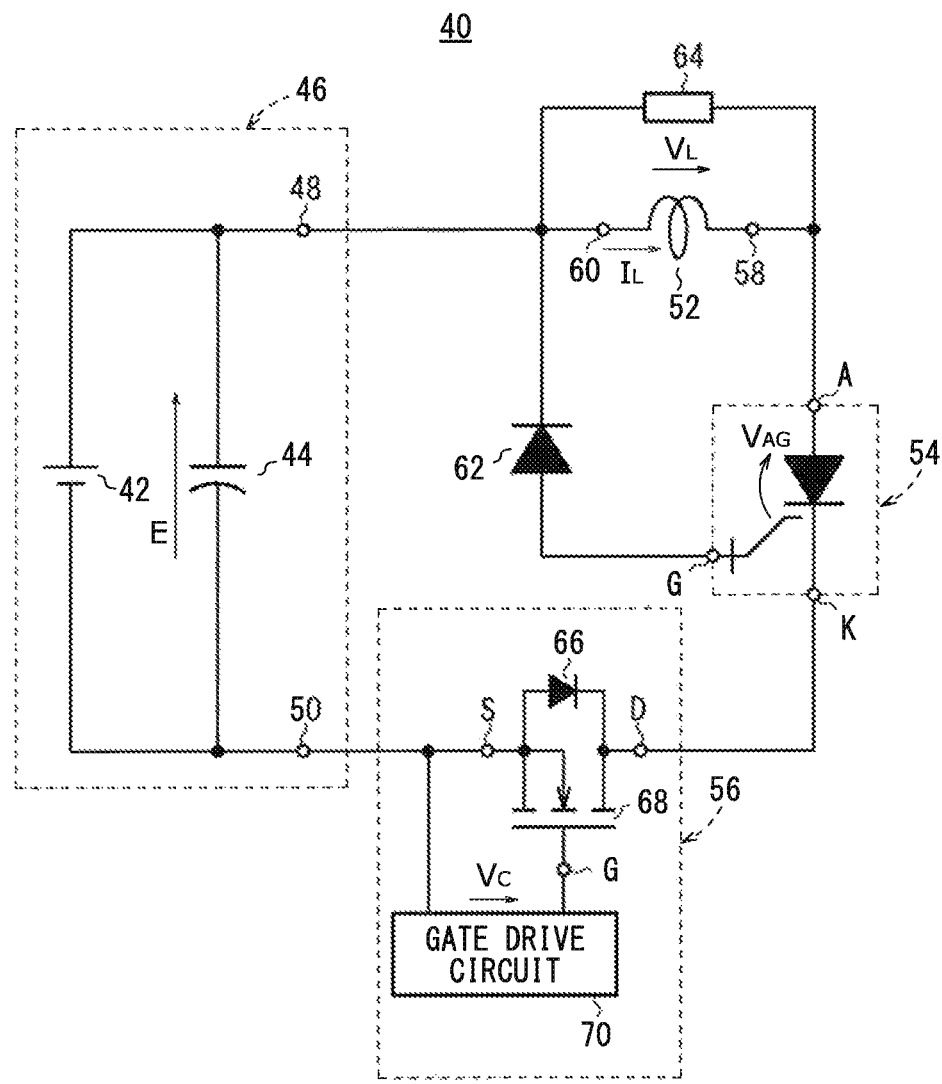
FIG. 5 is a circuit diagram of a high-voltage pulse generating circuit to which the semiconductor device is connected.

As shown in FIG. 5, the turn-on switching speed, turn-off switching speed, turn-on efficiency, and turn-off efficiency are evaluated using a high-voltage pulse generating circuit shown in FIG. 1 of Japanese Laid-Open Patent Publication No. 2004-072994.

As shown in FIG. 5, in the high-voltage pulse generating circuit 40, a direct-current power source unit 46 contains a direct-current power source 42 and a capacitor 44 for reducing the high-frequency impedance. A coil 52, a first semiconductor switch 54, and a second semiconductor switch 56 are series-connected to both ends 48, 50 of the direct-current power source unit 46. One end 58 of the coil 52 is connected to an anode terminal A of the first semiconductor switch 54. A diode 62 is interposed between the other end 60 of the coil 52 and a control terminal (gate terminal) G of the first semiconductor switch 54 such that the anode is connected to the control terminal G. A load 64 requiring a high-voltage pulse is connected in parallel with the coil 52. The second semiconductor switch 56 contains a power metal-oxide semiconductor field-effect transistor 68 (hereinafter referred to as the power MOSFET 68) and a gate drive circuit 70. The power MOSFET 68 is equipped with an inverse-parallel-connected avalanche diode 66. The gate drive circuit 70 is connected to a gate terminal G and a source terminal S of the power MOSFET 68 to control the on and off states of the power MOSFET 68.

In the high-voltage pulse generating circuit 40, the semiconductor device 10 of this embodiment is connected as the first semiconductor switch 54, and a capacitor is connected as the load 64. An electric power is supplied to the high-voltage pulse generating circuit 40, and the semiconductor device 10 is turned on. After the elapse of a predetermined charging time, the semiconductor device 10 is turned off, and a high voltage is generated at both ends of the load.

The turn-on switching speed is evaluated in terms of a time elapsed until the first semiconductor switch 54 (the semiconductor device 10) is turned on after an on signal (high-level signal) is output from the gate drive circuit 70 to the gate terminal G of the power MOSFET 68 in the second semiconductor switch 56.

The turn-off switching speed is evaluated in terms of a time elapsed until the first semiconductor switch 54 (the semiconductor device 10) is completely turned into the off state after an off signal (low-level signal) is output from the gate drive circuit 70 to the gate terminal G of the power MOSFET 68 in the second semiconductor switch 56.

The turn-on efficiency is a ratio of an energy stored in the coil 52. The energy ratio is calculated from a current $I_L$, which flows through the coil 52 when the semiconductor device 10 is turned on. Thus, as the on voltage is lowered (the turn-on loss is reduced), the energy stored in the coil 52 is increased to improve the turn-on efficiency. On the contrary, as the on voltage is increased (the turn-on loss is increased), the energy stored in the coil 52 is reduced to lower the turn-on efficiency.

The turn-off efficiency is a maximum ratio, at which the energy stored in the coil 52 can be converted to an energy stored in the load (capacitor) 64. The maximum ratio is calculated from a highest voltage (highest generated voltage) $V_L$, which is generated between both ends of the load 64 when the semiconductor device 10 is turned off. Thus, as the turn-off leakage current is reduced (the turn-off loss is reduced), the highest generated voltage $V_L$ is increased, so that the ratio of the conversion to the energy stored in the load (capacitor) 64 is increased, resulting in improvement of the turn-off efficiency. On the contrary, as the turn-off leakage current is increased (the turn-off loss is increased), the highest generated voltage $V_L$ is lowered, so that the ratio of the conversion to the energy stored in the load (capacitor) 64 is reduced to lower the turn-off efficiency.

First Example

In First Example, the semiconductor devices 10 of Examples 1 to 5 and Reference Examples 1 and 2, which had various thicknesses ta of the epitaxial layers 38, were evaluated with respect to the arrangement pitch of the embedded segments 30, the turn-on switching speed (relative speed), and the turn-off switching speed (relative speed).

Example 1

The semiconductor device of Example 1 was produced such that the thickness tb of the semiconductor substrate 12 was 460 μm, the thickness tc of the anode segment 28 was 1.5 μm, and the thickness ta of the epitaxial layer 38 was 10 μm in the semiconductor device 10 shown in FIGS. 1 to 4B.

Examples 2 to 5

The semiconductor devices of Examples 2, 3, 4, and 5 were produced in the same manner as Example 1 except that the thicknesses ta of the epitaxial layers 38 were 5, 2, 1, and 0.5 μm, respectively.

Reference Examples 1 and 2

The semiconductor device of Reference Example 1 and 2 were produced in the same manner as Example 1 except that the thickness ta of the epitaxial layer 38 were 13 and 0.1 μm respectively.

Evaluation

The arrangement pitch Pa of the embedded segments 30 was obtained by a simulation. In the simulation, the epitaxial layer 38 was grown to a predetermined thickness under such a condition that the channel segments 31 had a constant width (constant distance between the adjacent embedded segments 30) of 2 μm.

The turn-on and turn-off switching speeds were evaluated using the high-voltage pulse generating circuit 40 shown in FIG. 5 (the high-voltage pulse generating circuit shown in FIG. 1 of Japanese Laid-Open Patent Publication No. 2004-072994) as described above.

Thus, the turn-on switching speed was evaluated in terms of the time elapsed until the first semiconductor switch 54 (the semiconductor device 10) was turned on after the on signal (high-level signal) was output from the gate drive circuit 70 to the gate terminal G of the power MOSFET 68.

The turn-off switching speed was evaluated in terms of the time elapsed until the first semiconductor switch 54 (the semiconductor device 10) was completely turned into the off state after the off signal (low-level signal) was output from the gate drive circuit 70 to the gate terminal G of the power MOSFET 68.

The turn-on switching speed (the time elapsed until the semiconductor device 10 was turned on after the on signal output) of Reference Example 1 was represented by ton. The turn-on switching speeds of Examples 1 to 5 and Reference Example 2 were evaluated relative to the speed ton.

Similarly, the turn-off switching speed (the time elapsed until the semiconductor device 10 was completely turned into the off state after the off signal output) of Reference Example 1 was represented by toff. The turn-off switching speeds of Examples 1 to 5 and Reference Example 2 were evaluated relative to the speed toff.

The evaluation results are shown in Table 1.

TABLE 1

|  | Epitaxial layer thickness (μm) | Embedded segment arrangement pitch (μm) | Turn-on switching speed (evaluated with time (s)) | Turn-off switching speed (evaluated with time (s)) |
|---|---|---|---|---|
| Reference Example 1 | 13 | 23.0 | ton | toff |
| Example 1 | 10 | 20.0 | 0.86 × ton | 0.98 × toff |
| Example 2 | 5 | 15.0 | 0.64 × ton | 0.96 × toff |
| Example 3 | 2 | 12.0 | 0.50 × ton | 0.94 × toff |
| Example 4 | 1 | 11.0 | 0.46 × ton | 0.93 × toff |
| E Example 5 | 0.5 | 10.5 | 0.52 × ton | 0.95 × toff |

TABLE 1-continued

| | Epitaxial layer thickness (μm) | Embedded segment arrangement pitch (μm) | Turn-on switching speed (evaluated with time (s)) | Turn-off switching speed (evaluated with time (s)) |
|---|---|---|---|---|
| Reference Example 2 | 0.1 | 10.1 | 0.91 × ton | 1.21 × toff |

As shown in Table 1, in Examples 1 to 5, the embedded segments 30 had a small arrangement pitch Pa, which was advantageous for reducing the chip area. Furthermore, the turn-on and turn-off switching speeds of Examples 1 to 5 were higher than those of Reference Example 1. In particular, the turn-on and turn-off switching speeds of Examples 3 and 4 were significantly increased. In Example 5, due to the smaller thickness ta of the epitaxial layer 38, the conductivity of the embedded segments 30 was lowered, whereby the switching speeds were lower than those of Examples 3 and 4. In Reference Example 2, due to the further smaller thickness ta of the epitaxial layer 38, the conductivity of the embedded segments 30 was further lowered, whereby the turn-off switching speed was lower than that of Reference Example 1.

Consequently, the thickness ta of the epitaxial layer 38 was preferably 0.5 to 10 μm, more preferably 1 to 10 μm, further preferably 1 to 5 μm, particularly preferably 1 to 2 μm.

Second Example

In Second Example, the semiconductor devices 10 of Examples 11 to 16 and Reference Example 11, which had various thicknesses tb of the semiconductor substrates 12, were evaluated with respect to the turn-on and turn-off efficiencies.

Example 11

The semiconductor device of Example 11 was produced such that the thickness tb of the semiconductor substrate 12 was 440 μm, the thickness to of the epitaxial layer 38 was 2 μm, and the thickness tc of the anode segment 28 was 1.5 μm in the semiconductor device 10 shown in FIGS. 1 to 4B.

Examples 12 to 16

The semiconductor devices of Examples 12, 13, 14, 15, and 16 were produced in the same manner as Example 11 except that the thicknesses tb of the semiconductor substrates 12 were 430, 410, 360, 300, and 260 μm, respectively.

Reference Example 11

The semiconductor device of Reference Example 11 was produced in the same manner as Example 11 except that the thickness tb of the semiconductor substrate 12 was 200 μm.

Evaluation: Turn-On and Turn-Off Efficiencies

The turn-on and turn-off efficiencies were evaluated using the high-voltage pulse generating circuit 40 shown in FIG. 5 (the high-voltage pulse generating circuit shown in FIG. 1 of Japanese Laid-Open Patent Publication No. 2004-072994) as described above. In the high-voltage pulse generating circuit 40, the semiconductor device 10 was connected as the first semiconductor switch 54, and the capacitor was connected as the load 64. The electric power was supplied to the high-voltage pulse generating circuit 40, and the semiconductor device 10 was turned on. After the elapse of the predetermined charging time (4 μs), the semiconductor device 10 was turned off, and the high voltage was generated at both ends of the load.

The turn-on efficiency was evaluated in terms of the ratio of the energy stored in the coil 52. The energy ratio was calculated from the current, which flowed through the coil 52 when the semiconductor device 10 was turned on. Specifically, the energy ratio was obtained using the expression of (I/Io)×100 (%), in which Io (A) represented a current obtained in an optimum structure, and I (A) represented a current that practically flowed through the coil 52 when the semiconductor device 10 was turned on.

The turn-off efficiency was evaluated in terms of the maximum ratio, at which the energy stored in the coil 52 could be converted to the energy stored in the load (capacitor) 64. Specifically, the maximum ratio was obtained using the expression of (V/Vo)×100(%), in which Vo (V) represented a highest generated voltage obtained in an optimum structure, and V (V) represented a highest voltage (highest generated voltage) practically generated between both ends of the load when the semiconductor device 10 was turned off.

The evaluation results are shown in Table 2.

TABLE 2

| | Semiconductor substrate thickness (μm) | Turn-on efficiency (%) | Turn-off efficiency (%) |
|---|---|---|---|
| Example 11 | 440 | 83 | 76 |
| Example 12 | 430 | 84 | 72 |
| Example 13 | 410 | 85 | 68 |
| Example 14 | 360 | 89 | 58 |
| Example 15 | 300 | 91 | 43 |
| Example 16 | 260 | 94 | 33 |
| Reference Example 11 | 200 | 97 | 21 |

As shown in Table 2, in Examples 11 to 16, the turn-on efficiencies were at least 83% to achieve high device efficiencies. As the thickness tb of the semiconductor substrate 12 was reduced, the turn-off efficiency was lowered. However, even in Example 16, the turn-off efficiency was 33%, which was at a practical level (30% or more). In Reference Example 11, the turn-on efficiency was a high value of 97%, while the turn-off efficiency was 21% below the practical level.

Consequently, the thickness tb of the semiconductor substrate 12 was desirably less than 460 μm, preferably 440 μm or less, more preferably 260 to 440 μm, further preferably 300 to 430 μm, particularly preferably 360 to 410 μm.

Third Example

In Third Example, the semiconductor devices 10 of Examples 17 to 22, which had various thicknesses tc of the anode segments 28, were evaluated with respect to the turn-on and turn-off efficiencies.

Example 17

The semiconductor device of Example 17 was produced such that the thickness tb of the semiconductor substrate 12 was 460 μm, the thickness ta of the epitaxial layer 38 was 2 μm, and the thickness tc of the anode segment 28 was 1.0 μm in the semiconductor device 10 shown in FIGS. 1 to 4B.

Examples 18 to 22

The semiconductor devices of Examples 18, 19, 20, 21, and 22 were produced in the same manner as Example 17 except that the thickness tc of the anode segment 28 was 0.5, 0.2, 0.1, 0.05, or 0.02 μm respectively.

Evaluation: Turn-On and Turn-Off Efficiencies

The turn-on and turn-off efficiencies were evaluated in the same manner as Second Example, and the duplicate explanations thereof are omitted.

The evaluation results are shown in Table 3.

TABLE 3

| | Anode segment thickness (μm) | Turn-on efficiency (%) | Turn-off efficiency (%) |
|---|---|---|---|
| Example 17 | 1.0 | 82 | 81 |
| Example 18 | 0.5 | 81 | 81 |
| Example 19 | 0.2 | 79 | 82 |
| Example 20 | 0.1 | 79 | 82 |
| Example 21 | 0.05 | 78 | 82 |
| Example 22 | 0.02 | 77 | 83 |

As shown in Table 3, in Examples 17 to 22, the turn-off efficiencies were at least 81%. As the thickness tc of the anode segment 28 was reduced, the turn-on efficiency was lowered. However, even in Example 22, the turn-on efficiency was 77%, which was at a practical level (70% or more).

Consequently, the thickness tc of the anode segment 28 was desirably less than 1.5 μm, preferably 0.02 to 1.0 μm, further preferably 0.05 to 0.5 μm, particularly preferably 0.1 to 0.2 μm.

Fourth Example

In Fourth Example, the semiconductor devices 10 of Examples 31 to 48, which had various thicknesses tb of the semiconductor substrates 12 and various thicknesses tc of the anode segments 28, were evaluated with respect to the turn-on and turn-off efficiencies.

Example 31

The semiconductor device of Example 31 was produced such that the thickness tb of the semiconductor substrate 12 was 440 μm, the thickness ta of the epitaxial layer 38 was 2 μm, and the thickness tc of the anode segment 28 was 0.2 μm in the semiconductor device 10 shown in FIGS. 1 to 4B.

Examples 32 and 33

The semiconductor devices of Examples 32 and 33 were produced in the same manner as Example 31 except that the thicknesses tc of the anode segments 28 were 0.1 and 0.05 μm, respectively.

Example 34

The semiconductor device of Example 34 was produced in the same manner as Example 31 except that the thickness tb of the semiconductor substrate 12 was 430 μm.

Examples 35 and 36

The semiconductor devices of Examples 35 and 36 were produced in the same manner as Example 34 except that the thicknesses tc of the anode segments 28 were 0.1 and 0.05 μm, respectively.

Example 37

The semiconductor device of Example 37 was produced in the same manner as Example 31 except that the thickness tb of the semiconductor substrate 12 was 410 μm.

Examples 38 and 39

The semiconductor devices of Examples 38 and 39 were produced in the same manner as Example 37 except that the thicknesses tc of the anode segments 28 were 0.1 and 0.05 μm, respectively.

Example 40

The semiconductor device of Example 40 was produced in the same manner as Example 31 except that the thickness tb of the semiconductor substrate 12 was 360 μm.

Examples 41 and 42

The semiconductor devices of Examples 41 and 42 were produced in the same manner as Example 40 except that the thicknesses tc of the anode segments 28 were 0.1 and 0.05 μm, respectively.

Example 43

The semiconductor device of Example 43 was produced in the same manner as Example 31 except that the thickness tb of the semiconductor substrate 12 was 300 μm.

Examples 44 and 45

The semiconductor devices of Examples 44 and 45 were produced in the same manner as Example 43 except that the thicknesses tc of the anode segments 28 were 0.1 and 0.05 μm, respectively.

Example 46

The semiconductor device of Example 46 was produced in the same manner as Example 31 except that the thickness tb of the semiconductor substrate 12 was 260 μm.

Examples 47 and 48

The semiconductor devices of Examples 47 and 48 were produced in the same manner as Example 46 except that the thicknesses tc of the anode segments 28 are 0.1 and 0.05 μm respectively.

Evaluation: Turn-On and Turn-Off Efficiencies

The turn-on and turn-off efficiencies were evaluated in the same manner as Second Example, and the duplicate explanations thereof are omitted.

The evaluation results are shown in Table 4.

TABLE 4

| | Semiconductor substrate thickness (μm) | Anode segment thickness (μm) | Turn-on efficiency (%) | Turn-off efficiency (%) |
|---|---|---|---|---|
| Example 31 | 440 | 0.2 | 81 | 79 |
| Example | 440 | 0.1 | 81 | 79 |
| Ex. 33 | 440 | 0.05 | 81 | 79 |
| Ex. 34 | 430 | 0.2 | 82 | 77 |
| Ex. 35 | 430 | 0.1 | 82 | 77 |
| Ex. 36 | 430 | 0.05 | 82 | 77 |
| Ex. 37 | 410 | 0.2 | 82 | 75 |
| Ex. 38 | 410 | 0.1 | 82 | 75 |
| Ex. 39 | 410 | 0.05 | 82 | 75 |
| Ex. 40 | 360 | 0.2 | 84 | 70 |
| Ex. 41 | 360 | 0.1 | 84 | 70 |
| Ex. 42 | 360 | 0.05 | 84 | 70 |
| Ex. 43 | 300 | 0.2 | 85 | 63 |
| Ex. 44 | 300 | 0.1 | 85 | 63 |
| Ex. 45 | 300 | 0.05 | 84 | 63 |
| Ex. 46 | 260 | 0.2 | 87 | 58 |
| Ex. 47 | 260 | 0.1 | 86 | 58 |
| Ex. 48 | 260 | 0.05 | 86 | 58 |

As shown in Table 4, in Examples 31 to 48, the turn-on efficiencies were at least 81%, resulting in high device efficiencies. As the thickness tb of the semiconductor substrate 12 was reduced, the turn-off efficiency was lowered. In Example 16 (in which the thickness tb of the semiconductor substrate 12 was 260 μm), the turn-off efficiency was only 33%. In contrast, in Examples 46 to 48, though the thickness tb of the semiconductor substrate 12 was 260 μm, the turn-off efficiency was increased to 58%. It was considered that the increase was achieved by reducing the thickness tc of the anode segment 28.

It is to be understood that the semiconductor device of the present invention is not limited to the above embodiment, and various changes and modifications may be made therein without departing from the scope of the invention.

What is claimed is:

1. A semiconductor device comprising
a first conductive type semiconductor substrate,
at least one cathode formed on one surface of the semiconductor substrate,
an anode formed on the other surface of the semiconductor substrate, and
a gate electrode formed on the one surface of the semiconductor substrate to control current conduction between the cathode and the anode,
the gate electrode being electrically insulated from the cathode,
wherein the semiconductor device has
a first conductive type cathode segment disposed in a portion corresponding to at least the cathode in the one surface of the semiconductor substrate,
a second conductive type anode segment disposed in a portion corresponding to the anode in the other surface of the semiconductor substrate,
a plurality of second conductive type embedded segments sandwiched between the cathode segment and the anode segment in the semiconductor substrate, disposed in a portion closer to the cathode segment than to the anode segment,
a second conductive type takeoff segment disposed between the gate electrode and the embedded segments to electrically connect the gate electrode to the embedded segments,
a first conductive type channel segment disposed between the adjacent embedded segments adjacent to each other, and
the first conductive type cathode segment is in contact with the second conductive type takeoff segment,
wherein the first conductive type cathode segment is a single homogenous layer extending across an entirety of an element region of the semiconductor device, which is surrounded by a field limiting region, with only the second conductive type takeoff segment extending therethrough.

2. The semiconductor device according to claim 1, comprising a plurality of the cathodes,
wherein the gate electrode has a frame shape surrounding the cathodes, and
the takeoff segment is disposed immediately below the gate electrode to electrically connect the gate electrode to the embedded segments.

3. The semiconductor device according to claim 1, wherein the semiconductor substrate has a thickness of 440 μm or less.

4. The semiconductor device according to claim 1, wherein the anode segment has a thickness of 0.02 to 1.0 μm.

5. The semiconductor device according to claim 1, wherein the at least one cathode is surrounded by the gate electrode in the element region of the semiconductor device, and the element region is surrounded by the field limiting region and a channel stop region.

6. The semiconductor device according to claim 1, wherein the at least one cathode includes at least three cathodes and each of the plurality of second conductive type embedded segments extends continuously under the at least three cathodes.

7. The semiconductor device according to claim 1, wherein the semiconductor device has an epitaxial layer containing the cathode segment, the embedded segments, and the takeoff segment at a side of the one surface of the semiconductor substrate, and
the epitaxial layer has a thickness of at least 0.5 μm and less than 13 μm.

8. The semiconductor device according to claim 7, wherein the epitaxial layer has a thickness of 0.5 to 10 μm.

9. The semiconductor device according to claim 8, wherein the epitaxial layer has a thickness of 1 to 10 μm.

10. The semiconductor device according to claim 9, wherein the epitaxial layer has a thickness of 1 to 5 μm.

11. The semiconductor device according to claim 10, wherein the epitaxial layer has a thickness of 1 to 2 μm.

* * * * *